United States Patent [19]

Moraw

[11] 4,269,915
[45] May 26, 1981

[54] INFORMATION CARRIER ORIGINAL FOR ZERO ORDER DIFFRACTION PROJECTION

[75] Inventor: Roland Moraw, Naurod, Fed. Rep. of Germany

[73] Assignee: Hoechst Aktiengesellschaft, Frankfurt am Main, Fed. Rep. of Germany

[21] Appl. No.: 928,700

[22] Filed: Jul. 27, 1978

[30] Foreign Application Priority Data

Aug. 1, 1977 [DE] Fed. Rep. of Germany ....... 2734581

[51] Int. Cl.³ .................... G03C 5/00; G03C 11/00
[52] U.S. Cl. .................. 430/11; 350/162 R; 350/162 SF; 353/31; 430/13; 430/14; 430/18; 430/290; 430/321; 430/326; 430/394; 430/396; 430/494
[58] Field of Search ............. 96/27 R, 17, 35, 35.1, 96/30.3, 79, 80; 427/164, 162; 40/361; 353/31, 120, 121; 350/162 SF, 3, 5, 162 R; 430/11, 13, 14, 18, 290, 321, 326, 394, 396, 494

[56] References Cited

U.S. PATENT DOCUMENTS

| 3,097,096 | 7/1963 | Oster ........................................ 96/30 |
| 3,672,894 | 6/1972 | Glenn ..................................... 96/38.3 |
| 3,732,363 | 5/1973 | Glenn ............................. 346/76 L X |
| 3,743,507 | 7/1973 | Sen Ih et al. ..................... 96/38.3 X |
| 3,763,296 | 10/1973 | Burrows ............................... 96/30 X |
| 3,834,801 | 9/1974 | Schreckendgust .................... 353/20 |
| 3,947,105 | 3/1976 | Smith ......................... 350/162 SF X |
| 3,957,354 | 5/1976 | Knop ............................ 350/162 SF |
| 3,993,489 | 11/1976 | Heimsch et al. ..................... 96/80 X |
| 4,006,018 | 2/1977 | Wiese ................................... 96/30 X |
| 4,017,158 | 4/1977 | Booth ....................... 350/162 SF X |

Primary Examiner—Edward C. Kimlin
Attorney, Agent, or Firm—Schwartz, Jeffery, Schwaab, Mack, Blumenthal & Koch

[57] ABSTRACT

An original of an information carrier, and a process of making the carrier is disclosed in which the carrier comprises a layer of carrier material to which a layer of recording material has been applied, which recording layer contains a relief image reproducing the information. The relief image is comprised of a plurality of part-images in one plane, adjoining one another without overlapping, and having superimposed thereon a relief grid of different depths in the areas of the individual relief part-images. At least four relief part-images are utilized corresponding to the projection colors yellow, red, blue-violet and green.

8 Claims, 5 Drawing Figures

INFORMATION CARRIER ORIGINAL FOR ZERO ORDER DIFFRACTION PROJECTION

BACKGROUND OF THE INVENTION

The present invention relates on the one hand to an original of an information carrier, comprising a recording layer which has been applied to a carrier material and which contains a relief image reproducing the information. The relief image is composed of a plurality of relief part-images in one plane, which adjoin one another without overlapping and on which a relief grid of different grid depths is superposed in the areas of the individual relief part-images. In another aspect, the invention pertains to a process for preparing an original of this kind.

Images which are grid-wise screened are produced by the ZOD (Zero-Order-Diffraction) technique which is known from the journal, *Laser u. Opto-Elektronik*, No. 3/1976, pages 16/17. Three nickel matrices are produced from the relief images which, for example, correspond to three primary color grid patterns in yellow, magenta and cyan in three photo-lacquer layers, and these matrices are used to emboss colorless thermoplastic films of, for example, polyvinyl chloride. These films are mechanically superposed and, upon projection using conventional projectors, colored projection images are obtained from the colorless relief images. The grid-like screening is effected with relief grids of rectangular cross section, the grid period being about 1.5 $\mu$m. One nickel matrix of different relief depth is made for each color separation in magenta, yellow and cyan, and the separate embossed images are generated using these matrices. The relief depths differ, the relief depth of the cyan separation being the greatest and that of the yellow separation being the smallest. These color separation images are screened. The embossed images are superposed to give a three-layer relief image, from which colored images can be projected. The technique described gives very bright color images of high resolution. The relief images can be duplicated relatively cheaply and rapidly by embossing.

A disadvantage which makes the acceptance of this technique more difficult is the expensive preparation process with three completely separate working steps for making the individual embossed relief images corresponding to the color separations. A further disadvantage is the mechanical composing of the three separate relief images in a true fit to give the composite image required for the colored projection.

A solution which overcomes these disadvantages has already been suggested in co-pending application, Ser. No. 861,491, filed Dec. 16, 1977 by Roland Moraw et al and entitled "Information Carriers, Method of Forming and Copying Said Carriers". According to this teaching, the relief image is composed from the relief part-images corresponding to the individual color separations in such a way that areas of different color, which can also be screen dots in the case of screened images, are located in one plane, with these areas of different color not intersecting but at most touching one another. Relief images of this type are very suitable for depicting two-dimensional multi-colored originals, such as graphical illustrations, in the form of relief grid structures in one plane.

The invention disclosed in the aforementioned application Ser. No. 861,491, incorporated herein by reference, utilizes three primary colors, which in general would not be adequate for a representation, identical to the original, of multi-colored originals containing secondary colors, for example multi-colored landscape images.

SUMMARY OF THE INVENTION

It is an object of the present invention to provide an original of an information carrier which is suitable for the reproduction of any desired, complete color image, including images containing secondary colors.

Another object of the invention is to provide a method for preparing such an original.

According to the invention, this object is achieved when at least four relief part-images with grid structures of different depths in one plane, corresponding to the projection colors yellow, red, blue-violet and green, are provided.

The instant invention is an information carrier comprising a layer of carrier material and a recording layer which has been applied to said carrier material and which contains a relief image for reproducing the information, the relief image comprising a plurality of relief part-images on one plane, said relief part-images adjoining one another without overlapping, said recording layer having superposed thereon a relief grid of different grid depths in the areas of the individual relief part-images, and said plurality of relief part-images comprising at least four relief part-images having grid structures of different depths in one plane and corresponding to the projection colors yellow, red, blue-violet and green.

A process for preparing such an original information carrier is also disclosed. The process includes steps of: exposing the recording layer information-wise through individual color separation originals which are transparent in the areas of the appropriate projection color in the particular color separation original and of which the part-image areas of the projection colors adjoin one another without overlapping, said color separation originals corresponding at least to the colors violet-blue, green, yellow and red, exposing the recording layer to a grating, and developing the exposed recording layer to give a relief image.

DETAILED DESCRIPTION OF THE PREFERRED EMBODIMENT

The invention achieves the advantage that, by exposing the recording layer to the color separation originals of a color system consisting of only four main colors, namely blue-violet, green, yellow and red, a relief image of an original is obtained, by means of which these four main colors and all the secondary colors which can be produced by interlacing from these can be obtained for a complete color image by a single embossing due to the grid structures which are located in one single plane.

Figure 1:
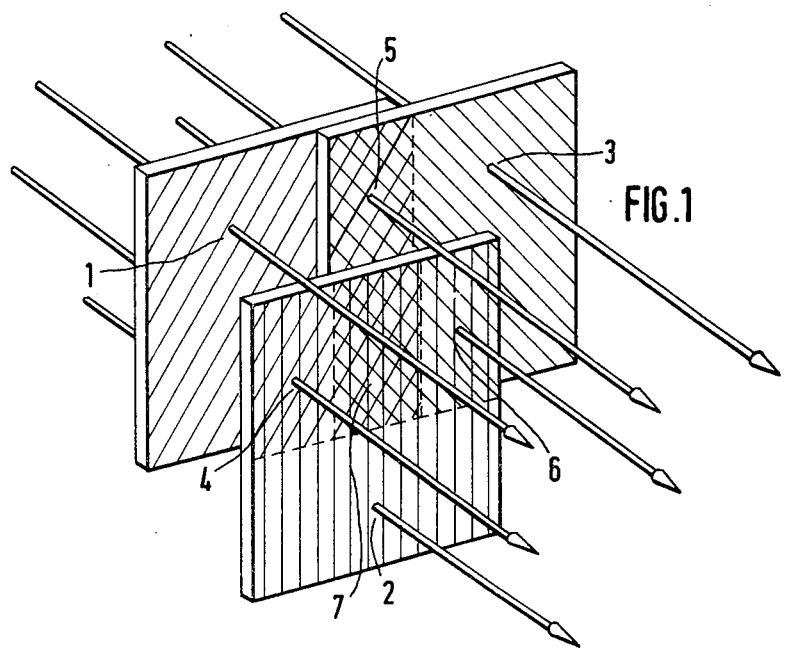
FIG. 1 shows, in a diagrammatic perspective view, the formation of secondary colors by subtractive superposition, as known in the state of the art.

In the state of the art according to the ZOD process, the formation of individual colors takes place by a subtractive process which is explained by reference to FIG. 1. Starting from the primary colors yellow (1), cyan (2) and magenta (3), secondary colors such as green (4), are formed by superposition of areas of yellow and cyan color, which areas are embossed as corresponding grid structures onto different films. Correspondingly, red (5) is formed by superposition of yellow (1) and magenta (3), and violet (6) is formed by superposition of magenta (3) and cyan (2). The superposition of all the primary colors gives black (7). The superposition of grid areas of different color for the subtractive formation of color is naturally not possible in one single plane so that the subtractive process cannot be used if relief grid structures for different projection colors are to be generated in one plane.

Figure 2:
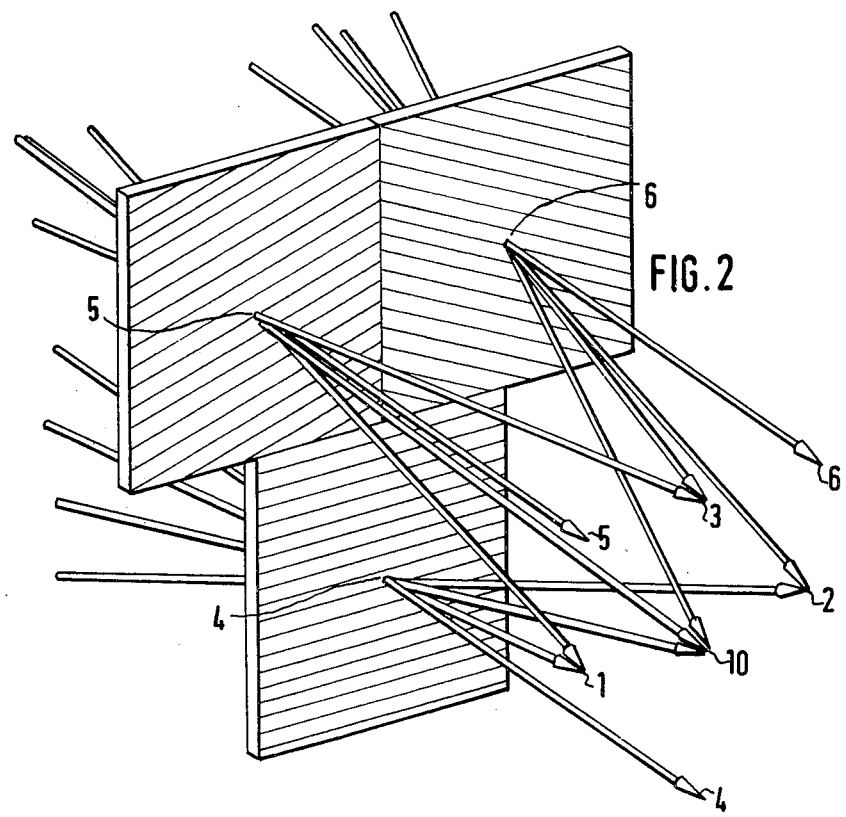
FIG. 2 shows diagrammatically, in a perspective representation, the formation of secondary colors by additive composition, as known in the state of the art.

With reference to FIG. 2, the likewise known additive process starts from the main colors violet (6), green (4) and red (5). For example, yellow (1) is formed from green (4) and red (5) light. Blue (2) and magenta (3) are correspondingly formed. In copying materials which are conceived in accordance with the additive color system, an image element, for example a screen dot, may be employed, consisting of one green (4), one red (5) and one violet color filter area (6), as FIG. 2 shows. The color filter areas are arranged in one plane, adjacent to one another without overlaps. If radiation passes through all three color filter areas, the screen dot appears white; if radiation passes through only one or two color filter areas, the projected screen dot is colored, corresponding to the one or two color filter areas through which radiation has passed.

The undesired color fraction can be rendered inactive by covering the particular color filter area, for example, by developed silver grains in a photographic layer. It is evident that the brightness of color images projected by the additive technique is not as high as that of color images projected by the subtractive technique, since, in the former case, radiation passes only through two part-areas of the screen, while in the latter case, radiation passes through all three part-areas. A further disadvantage of the additive technique described is the sub-division of the image elements, which as a rule are screen dots, into smaller surface areas, since this noticeably raises the requirements with respect to the accuracy of positioning the color separation originals, when the photo-lacquer (or photoresist) layer is exposed through different color separation originals.

The color system according to the invention gives projection images of exactly the same brightness as the subtractive color system, and it avoids the difficulties with respect to the accuracy of positioning, such as those which occur in the additive process. Furthermore, it has the advantage of storing the complete image in the form of relief grid structures in one plane.

It can be seen from the description of the additive and subtractive color systems having, in each case, three main colors that the difficulty resides in the generation of the secondary colors. In order to avoid this difficulty, four main colors are used according to the invention, in addition to black and white. The main colors are blue-violet (430–480 nm), green (510–540 nm), yellow (560–600 nm) and red (610–650 nm). These four main colors cover the visible range of the spectrum in a manner in which the gaps between the individual main color ranges are much smaller than in the case of only three main colors. For example, for the representation of magenta by the two main colors red and blue-violet, only the spectral ranges of these two main colors are thus required, which ranges have a smaller spectral distance from one another by comparison with a color system having three main colors.

Figure 3:
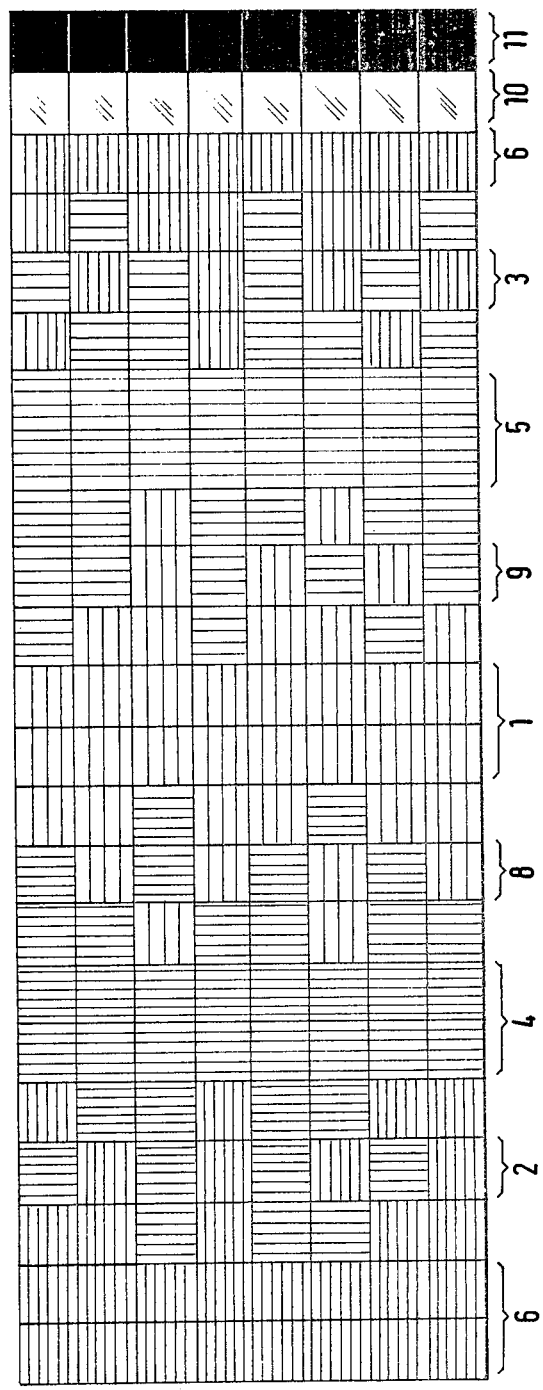
FIG. 3 shows diagrammatically the interlacing of the main colors when preparing an original.

The color image which is to be reproduced is screened, that is to say the image area is sub-divided into small part-areas. Each screen dot area which is not black or white contains only one of the four main colors. Secondary colors are formed by interlacing screen dots of different color, it also being possible that the screen dots of one color possess different intensities. This is diagrammatically shown in FIG. 3, where the secondary colors blue (2), yellow-green (8), magenta (3) and orange (9) can be seen in addition to the four main colors. White screen dots (10) remain transparent and black screen dots (11) pass as little light as possible.

Figure 4:
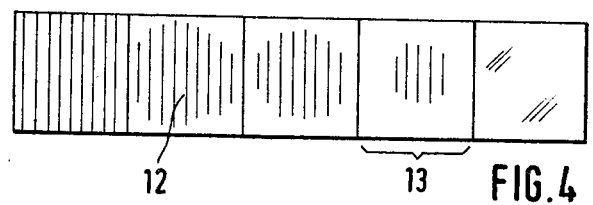
FIG. 4 shows a plurality of screen elements in graded color intensity represented diagrammatically, according to FIG. 3.

As can be seen from FIG. 4, the particular color intensity is determined by the color-generating fractional area 12 of the particular screen element 13. The color-generating fractional area 12 can contain screen elements 13 of all gradations between full coverage with color, i.e. 100% of homogeneous color being present, and the absence of coverage with color.

The reproduction of multi-colored images with the aid of four part-images, which generate the main colors blue-violet/green/yellow/red, with the assistance of corresponding grid structures in one plane is effected by projection using a focusing lens. To adjust the colors, grid structures can here have the form of screen dots. The technique according to the invention is also applicable for reproductions by screened optical systems, such as grid screens of cylindrical lenses or criss-cross screens of spherical lenses, in which cases a screen-like sub-division of the image is likewise necessary. The grid constant for the relief grid should here be selected in such a way that the light deflected in the first order of diffraction is incident on the regions between the lenses of the lens screen.

For finer gradations of color, the number of the main colors can be extended beyond four. In most cases, the reproduction of color using four main colors is quite satisfactory. White image areas are formed at grid-free image points or at image points having structures which effect only a relatively slight diffraction effect. The color black, which in practice is frequently approximated by a deep dark brown or deep dark violet, comes from highly structured image points which do not show any pronounced color effect. For example, very dark brown shades or blue shades appear at grid depths between 0.5 $\mu$m and about 1 $\mu$m in the case of relief grids in photo-lacquers (or photoresists) having a rectangular cross section. In the preferred preparation process for relief grid images of this type, the relief structure is first formed in photo-lacquer layers. A nickel matrix which is used to emboss a thermo plastic film of, for example, polyvinyl chloride, is taken from the relief grids in the photo-lacquer layers. If the refractive index of the photo-lacquer layer and the refractive index of the thermoplastic film are equal, for example 1.5, a color distortion does not occur in the embossed images. If the refractive indices differ, the relief depth in the photo-lacquer layer must be adjusted in such a way that the embossed image correctly reproduces the desired projection colors. The difference in optical path lengths, which is given by the grid depth and which is calculated as $d \cdot (n_1 - n_2)$ with $d$ = relief depth, $n_1$ = refractive index of the grid material and $n_2$ = refractive index of the external medium, $n_2$ being 1 in practice in the case of air, is a measure of the adaptation of depth. The four main colors blue-violet, green, yellow and red are obtained at differences in optical path lengths of about 0.3/1.2/0.6/0.8 μm, and this corresponds to relief depths in the photo-lacquer between about 0.6 μm and 2.1 μm.

Figure 5:
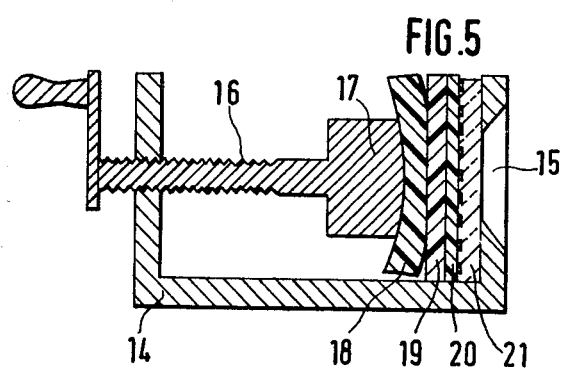
FIG. 5 shows a device for screening the recording layer.

Suitable processes for generating a relief image are described in the aforementioned application, Ser. No. 861,491. A photo-lacquer layer on a glass carrier or film carrier is exposed, in the sense of the present invention, through one color separation original each for blue-violet, green, yellow and red in such a way that, after development at the image areas concerned, relief structures of the desired grid depth have been generated. White image areas are here formed by overexposure or under-exposure. Black image areas are formed by exposure through originals which are suitable for generating structures which deflect the projection light as panchromatically as possible. The placing of the originals in a true fit onto the photo-lacquer layer in each case requires particular care, especially in the case of screened images. Depending on the desired image quality, customary 120 screens (120 screen periods/cm) or finer screens up to screen dots of 10 μm diameter are used, the latter requiring positioning accuracies between 10 μm and 1 μm. The color separation originals which are used, including the black separation original, are of such a nature that they are transparent only in the areas where images are to be formed in the particular case. A possible variant for white image areas is that at least two, or more, originals are transparent in these areas. The grid-wise exposure requires great care, in particular in the contact of the photo-lacquer layer and the grid original. This applies above all to grid originals which have high line densities of about 600 lines/mm and consist, for example, of metal ridges on glass plates and in the case of which the contact pressure in customary vacuum copying frames is not reliably sufficient. For this reason, the exposure is preferably carried out in a spindle press which is diagrammatically shown in FIG. 5 and which consists of an angle frame 14 having an aperture 15 for the incident light and a spindle 16. A curved spindle head 17 carries an elastic layer 18 which presses the recording material, consisting of a carrier 19 and a photo-lacquer layer 20, against the grid original 21.

Layers of photo-lacquer which are about 2.5 μm thick and which are exposed image-wise and grid-wise, are the starting material for the preparation of originals. The image-wise exposure is preferably effected in contact with the particular color separation original and the grid-wise exposure is preferably effected in contact with a grid original, for example, a glass plate having areas which are transparent to light and areas which are covered by metal ridges in order to be made opaque. In the case of the preferred positive photo-lacquers which contain o-quinone diazides and in which the exposed parts of the layer are dissolved away on development, actinic light is radiated in, for example, parallel light from a 200 watt mercury high-pressure lamp, through a quartz lens having a focal length of $f = 15$ cm and through a blue glass filter having a maximum transmission of 75% of the light intensity at the wavelength of 400 nm. To prepare a metal matrix for embossing the information carrier, the original is coated with a thin electrically conductive layer on which a metal coating is deposited by electroplating. Subsequently, the original and the metal coating, the surface of which contacting the original represents the negative relief image of the original, are separated from one another. A deformable material, from which the information carrier is produced, for example polyvinyl chloride, is embossed with the metal matrix prepared in this way in a manner which is in itself known, under pressure and with a lowering of the viscosity, which in most cases depends on the temperature.

EXAMPLE

An approximately 2.5 μm thick layer of a photo-lacquer which produces a positive is applied by centrifugal force and drying to a smooth transparent polyester film. Subsequently, this layer is brought under pressure into contact with a grid of 600 lines/mm, consisting of metal ridges on a glass plate, and irradiated with actinic light having an energy of 280 milli-wattseconds/cm$^2$. This light energy is required for a complete grid-wise exposure of the photo-lacquer layer through to the polyester carrier.

It was found in preliminary experiments that, at the same intensity and with increasing exposure times, projection colors occur in the order brown-yellow/magenta/blue-violet/yellow/red/magenta/cyan/blue-green/green/yellow-green/magenta, and that the projection colors appear in the reverse order if the exposure times are further increased.

The first order of the colors is to be ascribed to increasing grid depths in the recording layer, while the reversal of the order of colors is the consequence of decreasing grid depths, as the result of overexposure of the layer.

After the complete exposure, the various color separation originals with a screen pattern corresponding to a 120 screen are successively put in place in a contact arrangement and, depending on the desired projection color, they are exposed for different lengths of time. The color separation originals are transparent only in the areas of the particular desired projection colors and in the white image areas. The placing of the color separation originals in a true fit onto the recording layer is effected under a microscope with the aid of register crosses under yellow safety light. For example, 110/130/150/200 milliwattseconds/cm$^2$ are radiated in for the projection colors green/red/yellow/blue-violet. These light energies are determined in preliminary experiments. The black separation original contains, in the image area concerned, a grid pattern of about 300 lines/mm in an orientation which is perpendicular or inclined to the grid structure which has already been completely exposed; about 150 milliwattseconds/cm$^2$ are radiated in. A resulting projection color is a dark greyish-brown. An aqueous alkaline developer is used for development. On projecting the relief image, with a lens of a light intensity of 1:2,8, a multicolored image similar to the master original, with secondary colors in correspondingly graded color intensities is obtained. White image areas are reproduced in white and black image areas of the master original are reproduced in dark brown.

In a second experiment, the light energies for the exposure through the color separation originals are fixed at 105/125/140/205 milliwattseconds/cm$^2$. Subsequently, a thin copper layer is vapor-deposited on the developed relief image, and nickel is deposited on the copper layer by electroplating. A polyvinyl chloride film is embossed in a press at about 130° C. with the nickel matrix thus prepared. On projection in an undiffracted path of rays, the relief image generated by a single embossing in the polyvinyl chloride film gives a colored image which is largely identical to the projected image of the original relief image.

What is claimed is:

1. An original of an information carrier, comprising: a layer of carrier material; and a recording layer which has been applied to said carrier material and which contains a relief image for reproducing in zero order diffraction color projection an information stored in said relief image, the relief image being composed of a plurality of relief part-images on the free surface of the recording layer, said relief part-images comprising relief grids having different grid depths of rectangular profile in the areas of the individual relief part-images, said plurality of relief part-images comprising at least four relief part-images adjoining one another without overlapping, and said grid depths of the relief part-images being selected in a manner that the zero order diffraction color projection with polychromatic light provides the colors yellow, red, blue-violet and green.

2. An original as defined in claim 1, wherein said plurality of relief part-images further comprises four additional relief part-images having grid depths corresponding to the projection colors blue, magenta, yellow-green and orange.

3. An original as defined in claim 1 or 2, wherein said recording layer further comprises transparent areas through which light can pass, said transparent areas having no superposed grid structures thereon.

4. An original as defined in claim 1, 2 or 3, wherein said recording layer further comprises relief part-images formed by structures which attenuate the intensity of the projected light over the entire visible range of the spectrum.

5. An original as defined in claim 1, wherein each of the relief part-images represents a screen dot area in one of the four main projection colors yellow, green, red and blue-violet.

6. An original as defined in claim 5, wherein areas of screen dots of different colors are mutually interlaced in one plane in the recording layer.

7. An original as claimed in claim 3, wherein the grid structures of the relief part-images comprise depth differences corresponding to differences in optical path lengths from about 0.3 $\mu$m to 1.3 $\mu$m.

8. In an original of an information carrier for use in zero order diffraction color projection comprising:
   (a) a layer of carrier material,
   (b) a single recorded surface on said layer of carrier material, said recorded surface consisting of a developed photoresist layer having a plurality of relief part-images, the improvement comprising said relief part-images adjoining one another without overlap, each of said relief part-images having a grid pattern of rectangular profile and of different grid-depths, said grid pattern being produced by exposure of said recorded surface on said layer of carrier material to a suitable radiation passing a grid original, and
   (c) the said plurality of relief part-images comprises at least four relief part-images the zero order diffraction color projection with polychromatic light of these part-images yielding the colors yellow, red, blue-violet and green.

* * * * *

UNITED STATES PATENT OFFICE
CERTIFICATE OF CORRECTION

Patent No. 4,269,915     Dated May 26, 1981

Inventor(s) Roland MORAW

It is certified that error appears in the above-identified patent and that said Letters Patent are hereby corrected as shown below:

Column 6, line 22, kindly delete "ligh" and insert
    instead -- light --.
Column 6, line 48, kindly delete "110/130/150/200"
    and insert instead -- 110/130/150/220 --.

Signed and Sealed this

Twenty-third Day of February 1982

[SEAL]

Attest:

GERALD J. MOSSINGHOFF

Attesting Officer     Commissioner of Patents and Trademarks